United States Patent [19]
Coronel et al.

[11] Patent Number: 5,874,345
[45] Date of Patent: Feb. 23, 1999

[54] METHOD FOR PLANARIZING TEOS $SiO_2$ FILLED SHALLOW ISOLATION TRENCHES

[75] Inventors: Philippe Coronel, Massy; Frederic Lebrun, Every; Renzo MacCagnan, Villabe, all of France

[73] Assignee: International Business Machines Corporation, Armonk, N.Y.

[21] Appl. No.: 751,596

[22] Filed: Nov. 18, 1996

[51] Int. Cl.[6] .................................................. H01L 21/76
[52] U.S. Cl. .......................... 438/427; 438/424; 438/435; 148/DIG. 50
[58] Field of Search .................................. 438/424, 425, 438/426, 427, 428, 429, 430, 431, 432, 433, 434, 435, 436, 437, 438; 148/DIG. 50

[56] References Cited

U.S. PATENT DOCUMENTS 4,836,885  6/1989  Breiten et al. .

FOREIGN PATENT DOCUMENTS 644584   3/1995  European Pat. Off. .
4340590  6/1994  Germany .

OTHER PUBLICATIONS

"Selective Oxide: Nitride Cry Etching in a High Density Plasma Reactor", Extended Abstracts, vol. 93/1, 1993 Princeton, New Jersey US, pp. 369–370, XP000430479.

"New Etch Process for Luna ES1 Shallow Trench Isolation (IT ETCH)", IBM Technical Disclosure Bulletin, vol. 37, No. 12, Dec. 1994 New York US, pp. 475–476, XP000568024.

*Primary Examiner*—Trung Dang
*Attorney, Agent, or Firm*—Robert A. Walsh

[57] ABSTRACT

According to the present invention, there is disclosed a method for planarizing TEOS $SiO_2$ filled shallow isolation trenches according to a planarization main step which is comprised of three processing steps. The starting structure (10) consists of a silicon substrate (11) coated by a patterned $Si_3N_4$ layer (12) which delineates shallow trenches (20A, 20B) with a conformal layer (22) of TEOS $SiO_2$ formed thereon. A planarizing medium, typically two superimposed photoresist layers (24.25) is formed onto the resulting structure to provide a substantially planar surface. At this stage of the fabrication, the structure is standard. Now, this planar surface is translated by a non selective two-steps plasma etching in the TEOS $SiO_2$ layer (22). Next, should some photoresist material remain onto the structure it would be removed. Finally, a highly selective TEOS $SiO_2/Si_3N_4$ RIE etching step is performed which stops on the $Si_3N_4$ layer. The preferred chemistry is $C_4F_8/Ar$ or $C_4F_8/CO/Ar$ mixture. There is no longer the notion of process window because both the "silicon polish" and "$Si_3N_4$ pad residuals" type of defects are eliminated. The present method offers significant advantages in terms of final test yield improvement, cost reduction and reproducibility.

16 Claims, 8 Drawing Sheets

METHOD FOR PLANARIZING TEOS SIO₂ FILLED SHALLOW ISOLATION TRENCHES

FIELD OF INVENTION

The present invention relates to the manufacture of semiconductor integrated circuits and more particularly to an improved method for planarizing TEOS SiO₂ filled shallow isolation trenches formed in a semiconductor substrate.

BACKGROUND OF THE INVENTION

In the manufacture of semiconductor integrated circuits (ICs), deep and shallow isolation trenches are extensively used, in particular in the manufacture of 16 Mbits DRAM chips. Deep trenches are created in a silicon substrate to define the storage capacitors while shallow trenches are used to isolate each capacitor trench from its neighbours. As far as shallow isolation trenches are concerned, a conventional process includes three basic steps: (1) forming shallow trenches in a silicon substrate provided with a patterned Si₃N₄ layer (IT mask), (2) filling said trenches with a layer of an insulating material such as TEOS SiO₂ and (3) planarizing the insulating layer. All these processing steps are conducted in the Shallow Trench Isolation (STI) module. The planarization basic step mentioned above is basically comprised of two main steps: (1) forming a layer of a planarizing medium having a substantially planar surface onto the TEOS SiO₂ layer and (2) a RIE etching (AB etch) followed by a chemical-mechanical polishing of the structure (referred to hereinbelow as the planarization main step). The aim of the planarization basic step as a whole is to produce a surface of the TEOS SiO₂ as planar as possible without any defect.

Figure 1:
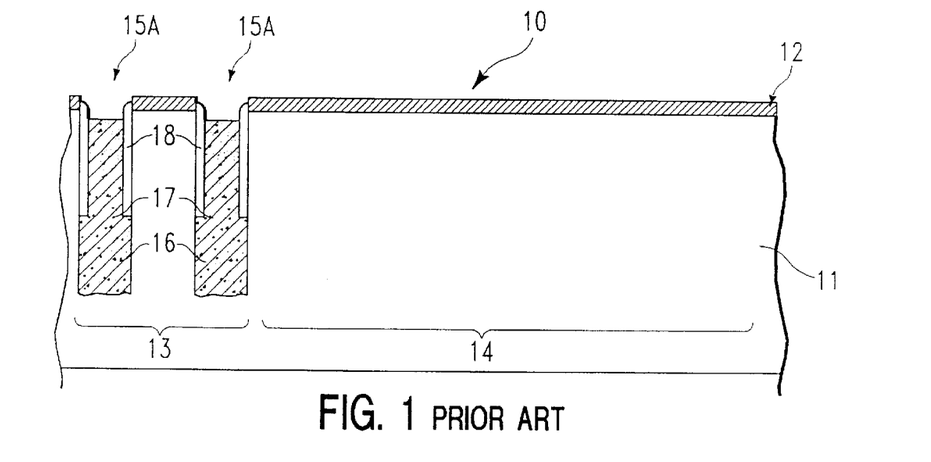
FIGS. 1 to 12 shows cross-sections of a semiconductor structure provided with deep trenches through the sequence of steps of a conventional process of fabricating shallow isolation trenches including the ultimate chem-mech polishing step for terminating the planarization of the TEOS $SiO_2$ layer filling the shallow trenches.

FIG. 1 schematically illustrates a structure 10 which is a part of a wafer consisting of a silicon substrate 11 with a passivation layer 12 formed thereon. Typically, this passivation layer 12 consists of a 14.5 nm thick SiO₂ bottom layer and a 175 nm (nominal) thick top Si₃N₄ layer. The passivation layer 12 will be referred to hereafter as the Si₃N₄ layer 12 for sake of simplicity. Basically, substrate 11 is comprised of two regions 13 and 14 referred to as the "array" and ".kerf/support/street" regions respectively. The memory elements, each being comprised of an active device (an IGFET) and a capacitor are integrated in the "array" area. The ".kerf/support/street" area includes all the test devices and the "glue" circuitry that are necessary to make these memory elements operative. Deep isolation trenches are only formed in the "array" region 13 as standard. Two deep trenches referenced 15A and 15B are shown in FIG. 1. Each deep trench, generically referenced 15 is partially filled with intrinsic polysilicon whose upper portion is doped. A classic ONO (Oxide/Nitride/Oxide) layer 16 isolates the polysilicon fill 17 from the silicon substrate 11. Surrounding the top portion of the polysilicon fill 17, an SiO₂ collar 18 is provided to increase the isolation between the doped polysilicon and the ONO layer 16 on the trench sidewall. As apparent from FIG. 1, the thickness of the Si₃N₄ layer 12 is substantially thinner above the "array" region 13 than above the ".kerf/support/street" region 14, e.g. about 120 nm compared to about 150 nm (there has been a partial consumption of the Si₃N₄ material forming passivation layer 12 mainly during collar formation). As such, structure 10 is a typical example of a part of a silicon wafer after a conventional deep isolation trench process used in the fabrication of 16 Mbits DRAM chips. Now, the shallow isolation trenches have to be delineated in the silicon substrate 11.

Figure 2:
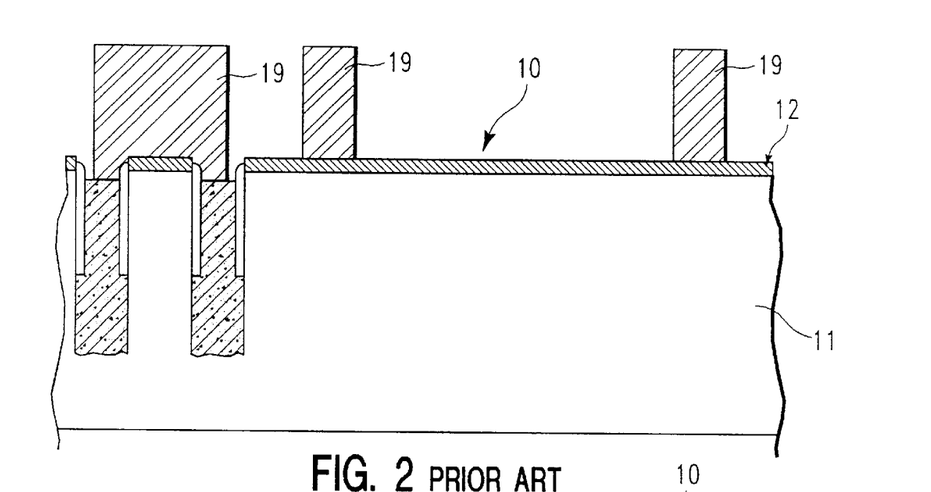
Figure 3:
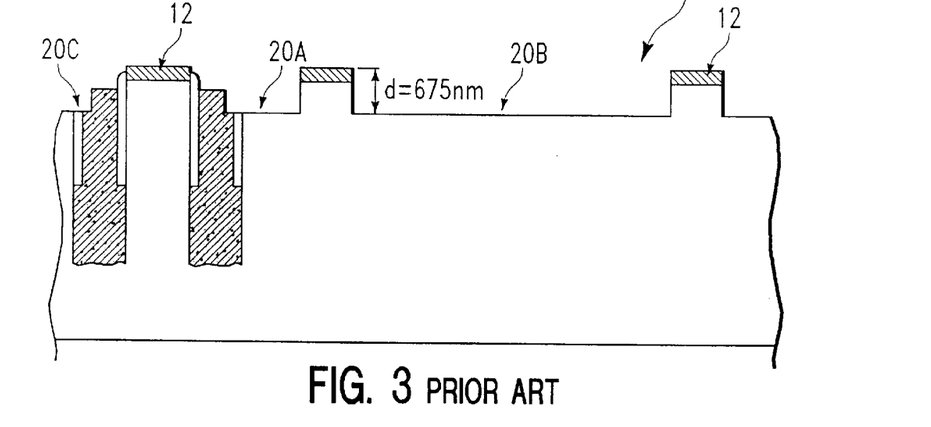

First, the structure 10 of FIG. 1 is coated with a layer 19 of a photosensitive material having a thickness of about 1.1 um. An adequate material is the photoresist labelled IP3250 commercially sold by TOKYO-OHKA, Tokyo, Japan. After deposition, the photoresist layer 19 is exposed, then baked and developed as standard to leave the patterned layer or mask still referenced 19 in FIG. 2. The purpose of this mask 19, referred to as the IT mask, is to define the locations of the shallow trenches at the surface of the silicon substrate 11. After the IT mask 19 has been defined, the process continues with the IT etch. The wafer is placed in an AME 5000, a MERIE plasma etcher manufactured by Applied Materials Inc., Santa Clara, Calif., USA with the following operating conditions:

NF₃ . . . : 8 sccm
N2 . . . : 65 sccm
CHF₃ . . . : 4 sccm
Pressure . . . : 5.32 Pa (40 mTorr)
Power . . . : 600 W
Mag. field . . . : 0 Gauss
Temp. cathode.: 20° C.
Time . . . : 275 s This etching mixture is not selective and thus attacks the different materials (polysilicon, SiO₂, Si₃N₄ and monocrystalline silicon) forming the exposed layers substantially at the same rate down to a deepness of about 675 nm. The IT mask 19 is then removed by ashing as standard. At this stage of the process, the structure 10 is shown in FIG. 3. Now turning to FIG. 3, two different sized shallow trenches, a narrow and a relatively wide, have been shown and are referenced by numerals 20A and 20B. In the "array" region 13, shallow trenches are required to nest the active devices of the memory elements and therefore must be as small as possible to increase integration density. On the contrary, in the ".kerf/support/street" area, the trenches are relatively wide for test device isolation. As apparent from FIG. 3, it remains isolated Si₃N₄ pads still referenced 12.

Figure 4:
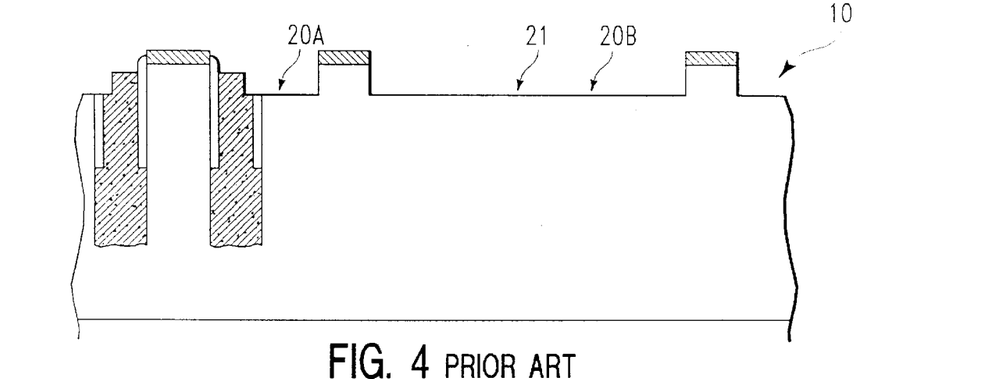

The next step consists in the thermal growth of a sacrificial thin SiO₂ layer on the portions of horizontal surfaces that are not protected by said Si₃N₄ pads 12 and on the sidewalls of the shallow trenches 20A and B formed in the silicon substrate 11. This oxidation of silicon surfaces is performed in order to eliminate surface damages due to the preceding reactive ion etching (RIE) step (IT etch). At this stage of the process, as apparent from FIG. 4, the bottom and sidewalls of shallow trenches 20A and 20B are covered with a thin sacrificial SiO₂ layer 21 having a thickness of about 22.5 nm (layer 21 will no longer be illustrated in the drawings).

Figure 5:
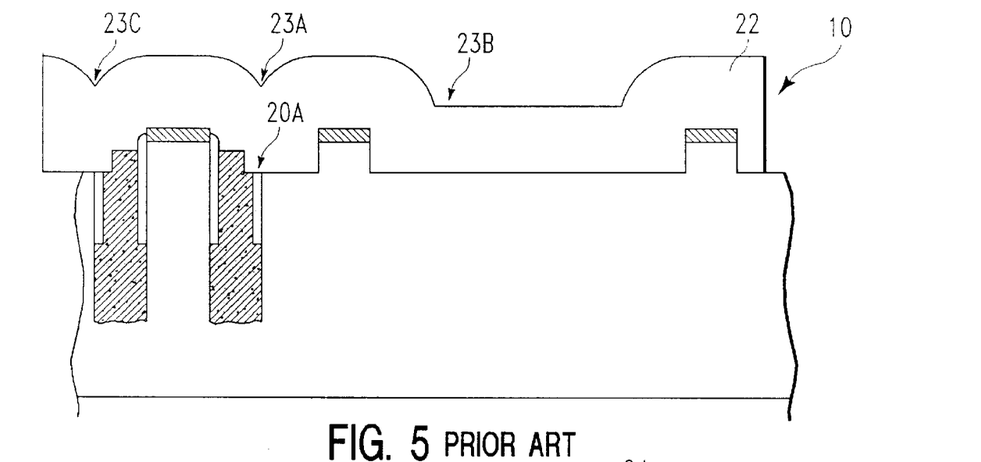
Figure 6:
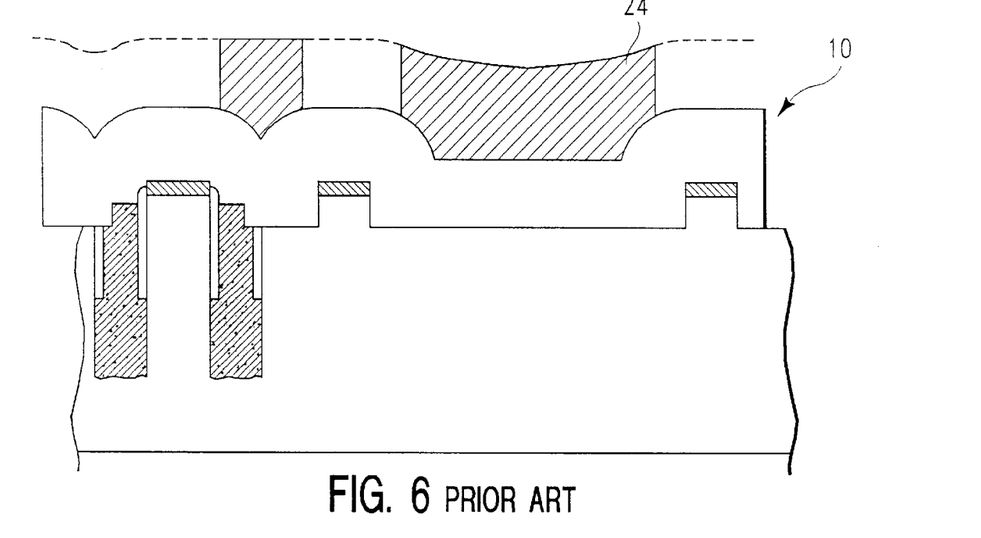

Now, the shallow trenches 20A and 20B are filled with TEOS SiO₂ material. To that end, a TEO₂S SiO layer 22 is conformally deposited onto the structure 10 with a thickness of about 845 nm to overfill the trench. An overfill of 175 nm is the target. This TEOS SiO₂ layer 22 is generally formed by LPCVD (Low Pressure Chemical Vapor Deposition) or PECVD (Plasma Enhanced Chemical Vapor Deposition) techniques using tetra ethyl ortho silicate (TEOS) and oxygen as standard. The resulting structure is shown in FIG. 5. A small depression 23A and a wide depression (or recess) 23B can be noticed above respective shallow trenches 20A and 20B. Another small depression referenced 23C is also illustrated in FIG. 5. Between depressions, the structure 10 surface presents typical mounts. At this stage of the fabrication, the structure 10 must be planarized and the initial thickness of the TEOS SiO₂ layer 22 must be reduced to a given value determined by the product specifications.

The planarization basic step now takes place. In reality, it is comprised of two main processing steps: first forming a planarizing medium onto the surface of the structure 10 of FIG. 5, then planarizing the structure approximately down to the surface of the $Si_3N_4$ pads 12 surface. In short, the main step of forming a planarizing medium will consist in the successive deposition of two photoresist layers and the planarization main step will be performed in two steps: first, an etch-back (referred to as the AB etch) of the structure which is performed in the same plasma etcher, then the resulting structure is chem-mech polished. In essence, the purpose of the AB etch is to reach the bottom of the recess 23B, while the purpose of the chem-mech polishing step is to have the final surface of the TEOS $SiO_2$ layer 22 quite planar and at about −60 nm with respect to the $Si_3N_4$ pads 12 surface.

Preferably, the main step of forming a planarizing medium is achieved in depositing two successive layers of photoresist. A first layer 24 (AB1) of a photoresist such as described in U.S. Pat. No. 5,273,856 assigned to IBM Corp. with a thickness of 830 nm is deposited onto the structure 10, then exposed, baked and developed as standard to leave a patterned layer referred to as AB1 mask still referenced 24. In essence, the aim of this mask 24 is to fill the wide depressions such as 23B and a determined number of small depressions such as 23A (but not 23C) as apparent from FIG. 5. This design is correlated to uniformity process problems to reduce the "silicon polish" related defects that will be discussed later on. Finally, the structure 10 is raised to a temperature sufficient (about 140° C.) to cause the photoresist material of AB1 layer 24 to flow and completely fill the depressions.

Next, a second 830 nm thick layer 25 of the same photoresist material is applied over layer 24 and baked. After this second step, we can consider that the wafer surface is coarsely planar. In fact, some resist bubbles can occur and a slight relief topography does exist at locations where layers 24 and 25 are superposed. At this stage of the process, the structure 10 is shown in FIG. 7.

Figure 7:
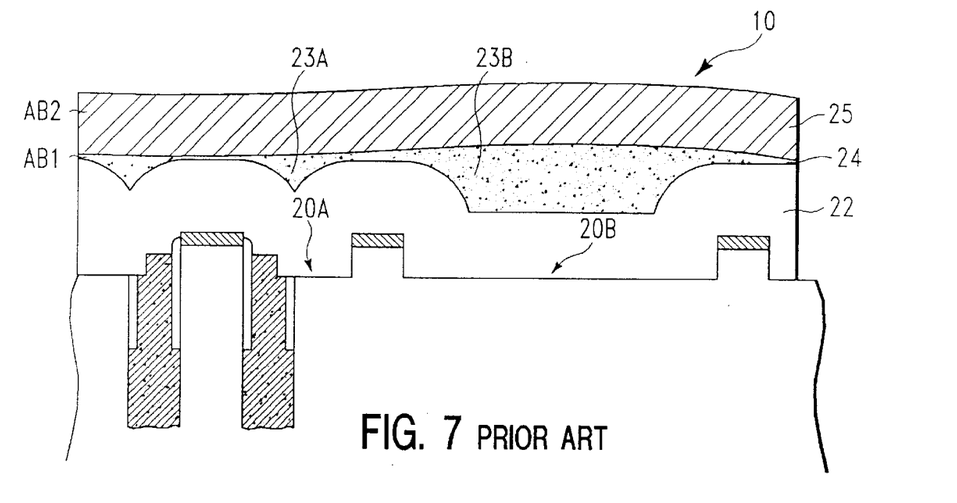

Now, the coarsely planarized surface of the FIG. 7 structure will be transferred to the TEOS $SiO_2$ layer 22 to produce a thinner but substantially planar layer all over the silicon substrate 11. In reality, the AB etch step mentioned above is completed in three different sub-steps, to adjust the TEOS $SiO_2$ layer 22 thickness whatever the pattern factor difference existing between the "array" and ".kerf/support/street" regions. The final objective is to etch the TEOS $SiO_2$ layer 22 surface at the mount locations until the bottom of the wide depression 23B is attained. All these three sub-steps are achieved in the AME 5000 plasma etcher mentioned above, only the chemistries are different.

According to the first sub-step, the wafer is placed in the AME 5000 plasma etcher and the top resist AB2 layer 25 is etched until the surface of the TEOS $SiO_2$ layer 22 (at mount locations) is reached. The operating conditions are:

$CHF_3$ . . . : 70 sccm
$NF_3$ . . . : 60 sccm
Pressure . . . : 18.25 Pa (137 mTorr)
Mag. field . . . : 0 Gauss
RF Power . . . : 562 W
Optical endpoint: Yes
Overetch . . . : 12 s
Sel. resist/TEOS: 1.5/1 (blanket)
Uniformity . . . : <2%

Figure 8:
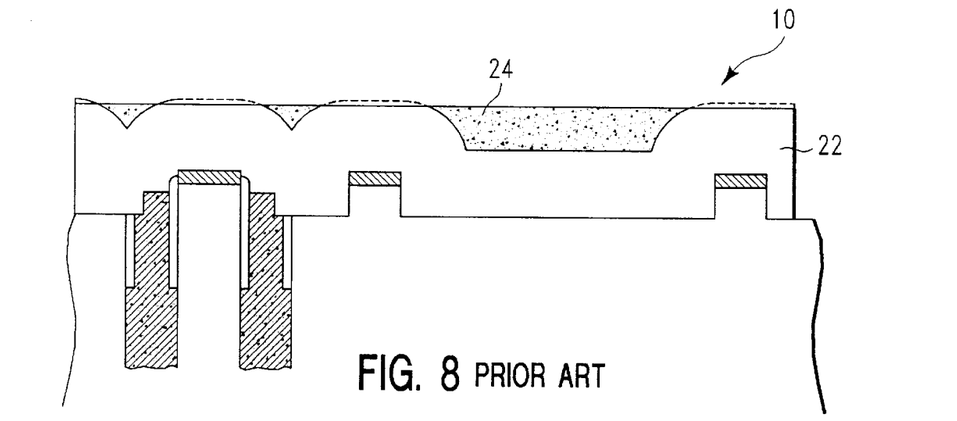

By means of an adequate algorithm, an interferometric optical endpoint is used to detect the AB2 layer 25/TEOS $SiO_2$ layer 22 interface. A fixed overetching is done after etch endpoint detection: about 40 nm of the TEOS $SiO_2$ layer 22 at the mount locations and of the bottom AB1 resist layer 24 are removed during this overetch. The resulting structure is shown in FIG. 8.

Now the second etching sub-step is performed with the following operating conditions:

$CHF_3$ . . . : 80 sccm
$NF_3$ . . . : 50 sccm
Pressure . . . : 30 Pa (220 mTorr)
Mag field . . . : 20 Gauss
RF Power . . . : 700 W
Etch time . . . : 30 sec
Sel. resist/TEOS: 1/1 (blanket)
Uniformity . . . : <2%

Figure 9:
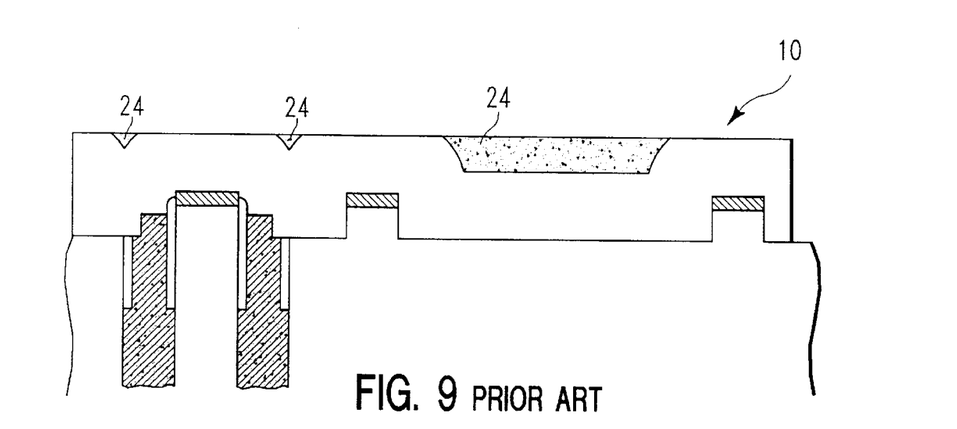

During this sub-step, the AB1 resist layer 24 and TEOS $SiO_2$ layer 22 are supposed to be etched at the same rate. It is not completely true because of the pattern factor between "array" and ".kerf/support/street" regions. About 160 nm are etched for both resist layer 24 and TEOS $SiO_2$ layer 22. At this stage of the fabrication, the structure is shown in FIG. 9. One may note the presence of small remains of the AB1 photoresist layer 24 at the location of the small depressions (e.g. 23A & 23C) and of a substantive remaining of the same at the location of the wide depression 23B. These remains will act as a mask for the subsequent processing step to be now described.

In the third and last sub-step, the TEOS $SiO_2$ layer 22 is etched using the following operating conditions.

$CHF_3$ . . . : 95 sccm
$CO_2$ . . . : 40 sccm
Pressure . . . : 20 Pa (150 mTorr)
Mag. field . . . : 25 Gauss
RF Power . . . : 900 W
Optical endpoint: Yes
Overetch . . . : No
Sel. TEOS/resist: 6/1 (blanket)
Uniformity . . . : <3%

Figure 10:
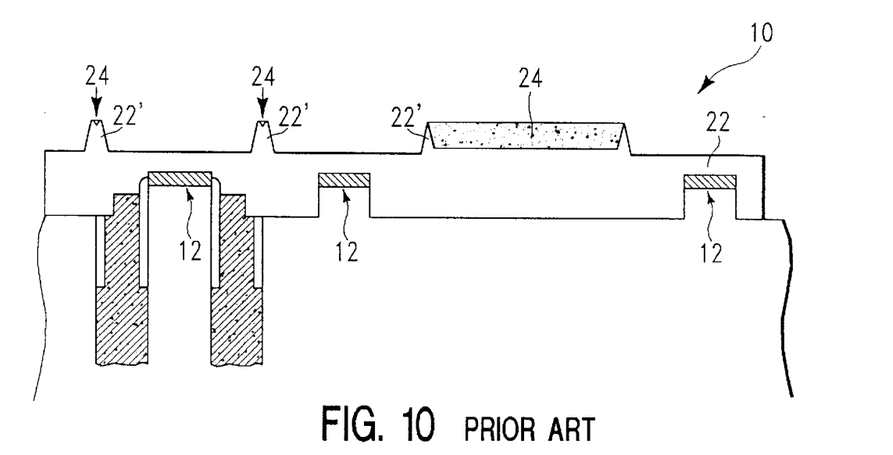

The resulting structure 10 at this stage of the process is shown in FIG. 10. This mixture has been selected so that during this sub-step, the TEOS $SiO_2$ of layer 22 is etched faster than the material forming the AB1 photoresist layer 24 in order to be sure to protect the TEOS $SiO_2$ material over the shallow isolation trenches 20A and 20B. As illustrated in FIG. 10, the etching has been conducted deeper in the "array" region 13 than desired (as mentioned above, the optimal level is the bottom of recess 23B). Due to different etch rates and anisotropic conditions, peak shaped TEOS $SiO_2$ remains, usually called "fences", are left at the structure 10 surface. They are referenced 22' in FIG. 10.

At the end of the AB etch, the thickness of the remaining TEOS $SiO_2$ layer 22 over $Si_3N_4$ pads 12 is measured.

Figure 11:
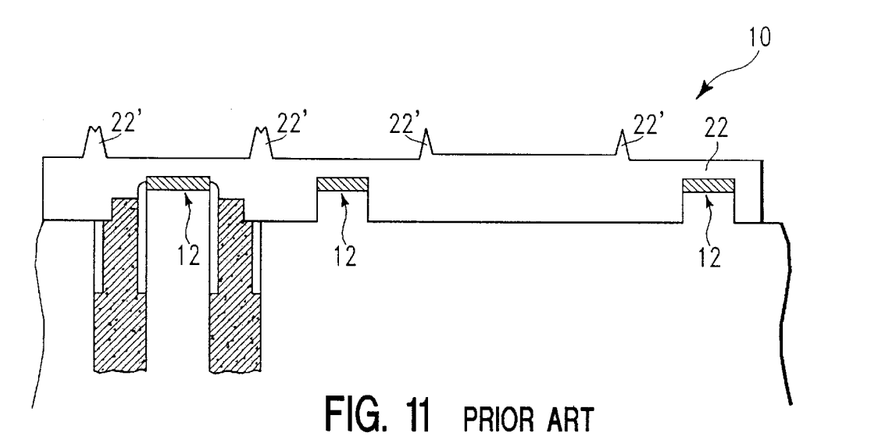

Finally, the remaining portions of the AB1 photoresist layer 24 are eliminated in a dedicated chamber of the AME 5000 plasma etcher. After photoresist stripping, the resulting structure 10 is shown in FIG. 11.

Figure 12:
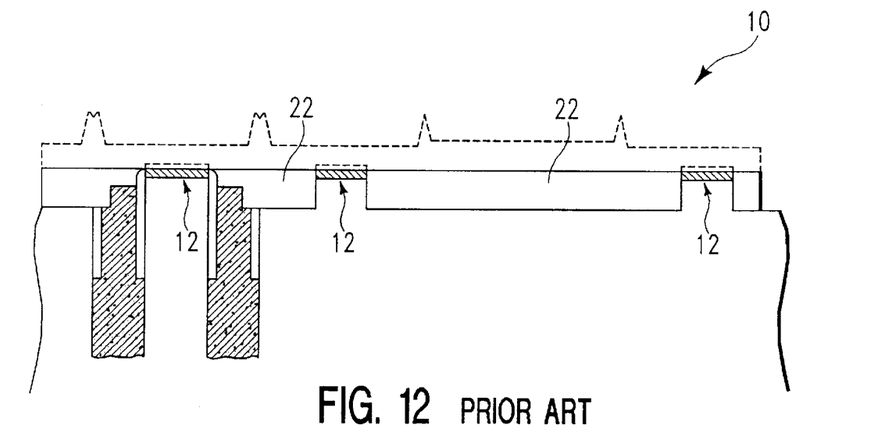

Now the step of chem-mech polishing is performed. During this step, the TEOS $SiO_2$ layer 22 remaining over the $Si_3N_4$ pads 12 is eliminated. The structure 10 is first chem-mech polished until the $Si_3N_4$ pad surface is reached and the polishing is continued down to about 60 nm under $Si_3N_4$ pads upper level. This step is achieved with commercially available polishing slurries. For example a suitable slurry is sold under commercial reference SC1 by CABOT-SPERCE, Eldorado Hills, Calif., USA. At this stage of the fabrication, the structure 10 is shown in FIG. 12.

The shallow trench formation process terminates by the steps of annealing the TEOS $SiO_2$ layer 22 and the removal of the $Si_3N_4$ pads 12. The anneal aims to densify the TEOS $SiO_2$ material so that the final thickness is the thickness of the TEOS $SiO_2$ layer 22 at the stage of FIG. 12 reduced by about 5%. At this stage of the fabrication, $Si_3N_4$ pads 12 are quite necessary to protect the underlying monocrystalline silicon that would otherwise suffer. The $Si_3N_4$ pads 12 stripping is performed by wet etching. As this wet process has a very high $Si_3N_4$/TEOS $SiO_2$ selectivity, it is not capable to etch the $Si_3N_4$ pads 12 in presence of a film of unpolished TEOS $SiO_2$ material remaining thereon, even this film is very thin (e.g. 1.5 nm). $Si_3N_4$ pads remains can be revealed only after this removal step.

Figure 13:
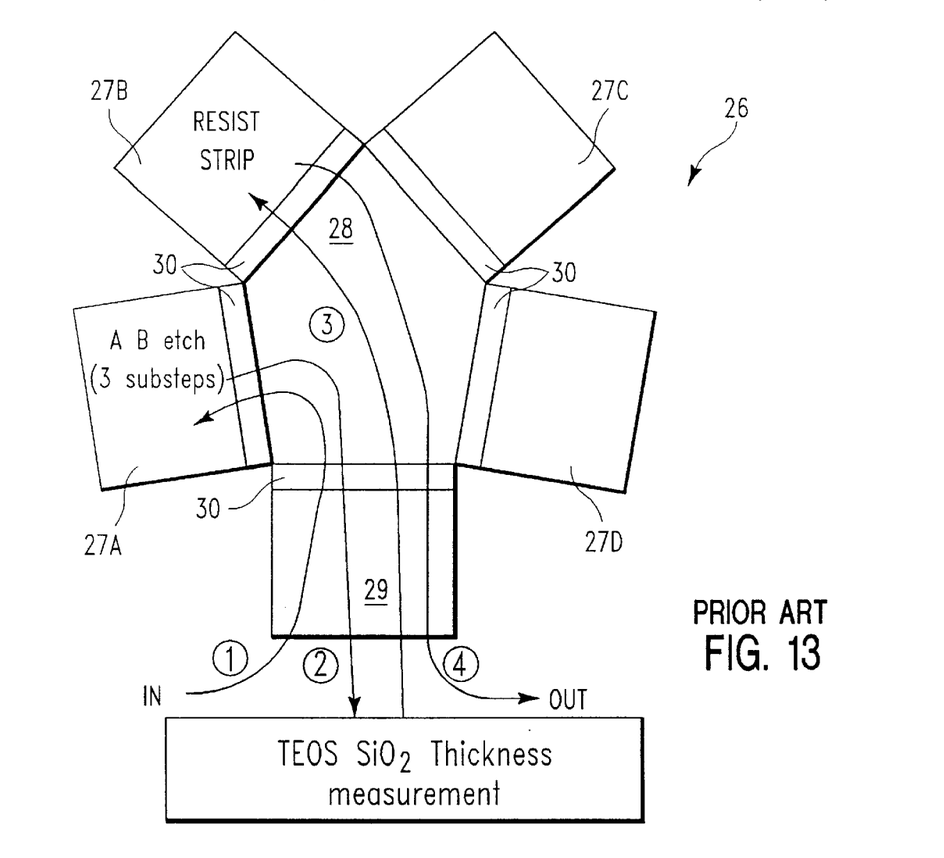
FIG. 13 shows the wafer road-map during the AB etch step wherein the wafer travels between two reaction chambers of a multi-chamber plasma etcher and a thickness measurement unit.

The wafer road-map for the total AB etch sequence will be summarized by reference to FIG. 13. Now turning to FIG.13, there is schematically shown the AME 5000 plasma etcher referenced 26 comprised of four chambers 27A to 27D, a central load/unload module 28, a queueing station 29 coupled thereto and finally, vacuum locks that are referenced 30. FIG. 13 also shows the thickness measurement apparatus (e.g. a PROMETRIX) which bears numeral 31. Arrows illustrate the movements of the wafer within plasma etcher 26. As apparent from FIG. 13, only two reaction chambers are necessary. The three above mentioned sub-steps are conducted in chamber 27A while the remains of AB1 photoresist layer 24 are stripped in chamber 27B. The TEOS $SiO_2$ thickness measurement is performed (above a $Si_3N_4$ pad in the ".kerf/support/street" region) in the meantime in apparatus 31.

Figure 14:
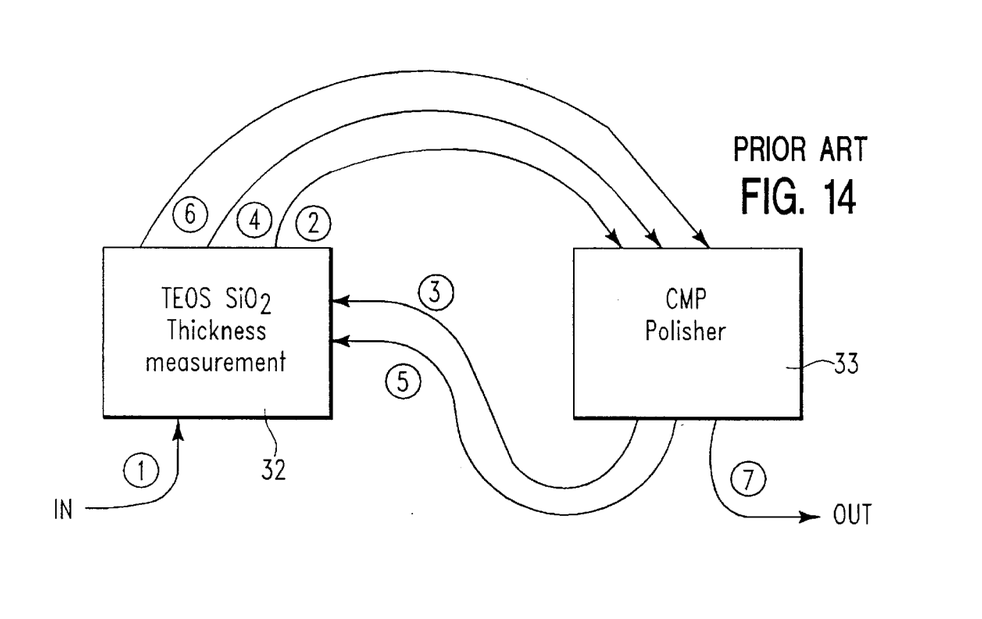
FIG. 14 shows the wafer road-map during the chem-mech polishing step wherein the wafer travels between the polisher tool and a thickness measurement unit.

In the present fabrication process, the chem-mech polishing is a long and expensive processing step. Unfortunately, due to process monitoring difficulties: etch rate drifts as a function of the number of wafers to be polished, different etch rates between "array" and ".kerf/support/street" regions referred to as the "dishing effect" in the technical literature, the chem-mech polishing step is not performed in a single run but rather in two or three runs. Before the first run and between runs, all the wafers must be measured (this time, the TEOS $SiO_2$ layer 22 thickness is measured at the center of a wide depression such as 23B) and process parameters adjusted. FIG. 14 shows the wafer road-map between the thickness measurement unit 32 (e.g. a PROMETRIX) and the chem-mech polisher 33 such as model 372M sold by WESTECH, Tempe, Ariz., USA. As known for those skilled in the art, the chem-mech polishing step has a very small process window since it is greatly dependent on all the previous processing steps, moreover it cannot heal any process variations. But, because the presence of fences 22' produced during AB etch, the chem-mech polishing step is really mandatory.

Figure 15:
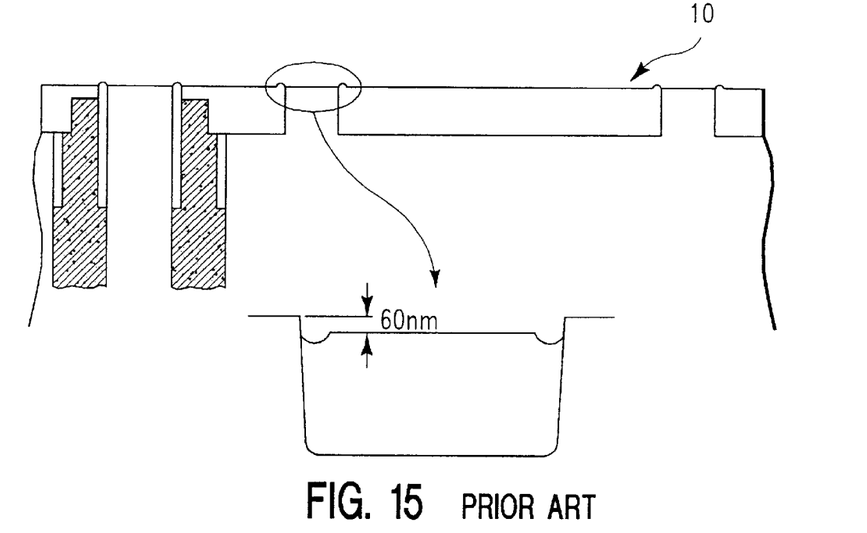
FIG. 15 shows a cross-section of the ideal structure that is sought at the end of the shallow trench fabrication process.

FIG. 15 illustrates the ideal structure that is sought at the end of the planarization main step described by reference to FIGS. 6 to 13. After the planarization main step, there is a "wrap-around" target of about −60 nm as clearly illustrated in the enlarged view of FIG. 15. Unfortunately, in spite of all the parameter adjustments mentioned above and outstanding cares, the wrap-around that is obtained can significantly vary between the first and the last wafer of a given lot and even between the "array" and ".kerf/support/street" regions of a same wafer.

Two types of problems appear when the above described planarization main step sequence (including the chem-mech polishing step which is a major contributor thereto) is used, they are usually referred to as "silicon polish" and "$Si_3N_4$ pad residuals". These problems have different causes, including the thickness variations of the $Si_3N_4$ layer 12 over the "array" and ".kerf/support/street" regions, the difficulty to properly control the chem-mech polishing step, and finally the effects due to different pattern factors.

Figure 16A:
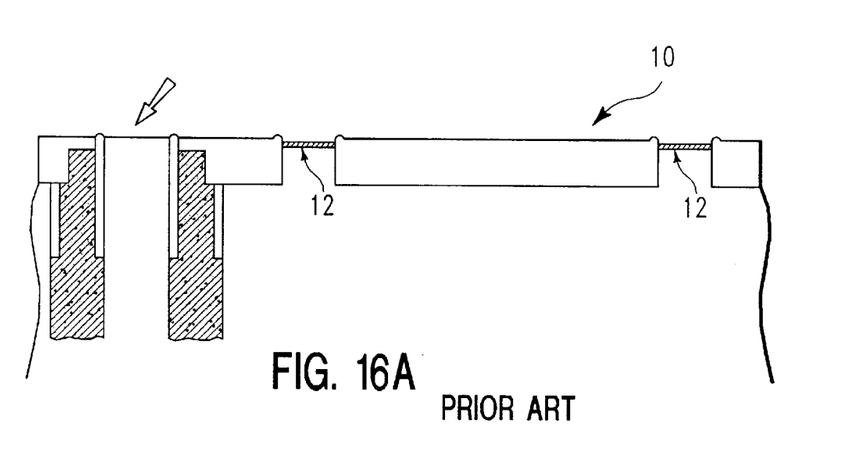
FIGS. 16A and 16B show the cross-section of FIG. 15 to illustrate the "silicon polish" and "$Si_3N_4$ pad residuals" type of defects respectively.

If the chem-mech polishing is "too important", some $Si_3N_4$ pads 12 will be completely removed and the silicon of substrate 11 is no longer protected during the anneal. As a final result, the gate oxide of IGFET's will be of poor quality. This case is illustrated in FIG. 16A where an arrow shows the exposed silicon surface. This directly results of the thickness variations in the $Si_3N_4$ layer 12 as mentioned above.

Figure 16B:
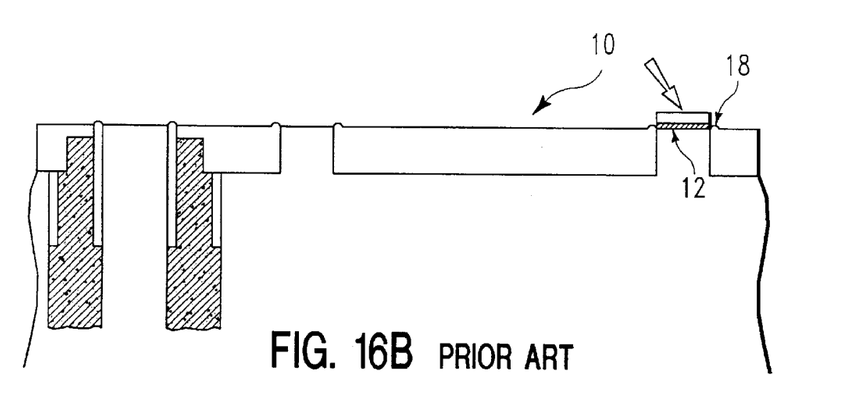

On the contrary, if the chem-mech polishing step is "not long enough", in this case, some TEOS $SiO_2$ material may remain over the $Si_3N_4$ pads 12 and will act as a hard mask protecting film during the above mentioned $Si_3N_4$ pad removal step thus preventing their complete removal. In this case, some $Si_3N_4$ pads remain under the gate conductors (GC) as known for those skilled in the art which in turn, cause the IGFET's to be inoperative. This case is illustrated in FIG. 16B where an arrow shows an unremoved $Si_3N_4$ pad.

In both cases, even if process adjustments made from measurements conducted in box 32 are appropriate, these defects cannot be satisfactorily corrected because chem-mech polishing is essentially a mechanical technique which cannot integrate all the possible variations or non-uniformities resulting from the previous processing steps. As a matter of fact, the process window of the chem-mech polishing step is very small and strongly depends on the product families. Zero yield at the final test can be expected for chips suffering of these defects. Finally, the above planarization step sequence does not allow the great reproducibility that is highly desired for the successful completion of processing steps to which the wafers will be subsequently submitted.

SUMMARY OF THE PRESENT INVENTION

The method of the present invention aims to get rid of all these drawbacks. According to the present invention, there is disclosed a method for planarizing TEOS $SiO_2$ filled shallow isolation trenches according to a new and improved planarization main step (referred to as the AT Etch) comprised of three processing steps. Basically, the notion of process window is dismissed because both the "silicon polish" and "$Si_3N_4$ pad residuals" type of defects are eliminated. The method of the present invention also offers significant advantages in terms of final test yields, cost reduction and reproducibility.

The starting structure consists of a silicon substrate provided with a patterned $Si_3N_4$ passivation layer. Deep and shallow trenches are then formed in the substrate. Next, these deep and shallow trenches are conformally filled with TEOS $SiO_2$. A planarizing medium (typically made by two superimposed photoresist layers referred to as AT1 and AT2 for the bottom and top layers respectively) is formed onto the resulting structure to provide a substantially planar surface. At this stage of the fabrication, the structure is produced by any conventional manufacturing process.

In essence, according to the method of the present invention, this planar surface is first translated by a non selective two-steps plasma etching in the TEOS $SiO_2$ layer, optionally followed by a stripping step to remove the remaining (if any) of the photoresist material and finally, a selective TEOS $SiO_2$/$Si_3N_4$ RIE etching step is performed which stops on the $Si_3N_4$ layer.

According to the first processing step, the AT2 photoresist layer is etched as usual in one reaction chamber of a multi-chamber RIE tool, such as an AME 5000 plasma etcher, using a $CHF_3/NF_3$ chemistry to etch the AT2 photoresist slightly faster than the TEOS $SiO_2$ material. Then, in the same chamber, the same chemistry is used, but with different parameters (e.g. a different gas ratio) in order to change the previous selectivity and have now the same etch-rate both for the AT1 photoresist and the TEOS $SiO_2$ material. The endpoint of this step is controlled by interferometry at the AT1 photoresist/TEOS $SiO_2$ interface. This step includes an overetch.

After this two-steps RIE etching has been completed, if some AT1 photoresist remains at the surface of the structure 10, it would be stripped with an O2/N2 plasma as standard in the same reaction chamber (or in a specific photoresist stripping tool as well).

Finally, the third and last step is accomplished, still in the same reaction chamber with a $C_4F_8/Ar$ (or $_4C_8F/CO/Ar$) chemistry that has a very high $Si_3N_4$/TEOS $SiO_2$ selectivity (i.e. which etches TEOS $SiO_2$ at least eight times faster than $Si_3N_4$). Etching is stopped when the interferometric endpoint detection apparatus detects the surface of the $Si_3N_4$ layer has been reached. This step includes an overetch whose duration depends upon product specifications, typically of the wrap-around value that is required by the next processing module.

The structure is now ready for being processed as described in the conventional fabrication process to remove the $Si_3N_4$ pads. However, still according to the present invention, the TEOS $SiO_2$ anneal is preferably performed before the new AT etch (i.e. just after the $SiO_2$ TEOS filling step has been completed).

With regard to the conventional planarization method of the prior art described above by reference to FIGS. 1 to 16, the chem-mech polishing step is totally eliminated. As a direct consequence, there is no longer any process window concern at this stage of the fabrication process and manufacturing yields are increased. In addition, thanks to the different etch endpoint controls, the reproducibility wafer-to-wafer is significantly improved. Note also that only one reaction chamber is used instead of two and the different TEOS $SiO_2$ layer thickness measurements are no longer practiced.

The improved new planarization main step (AT Etch) of the present invention finds extensive applications in the semi-conductor industry, and in particular in the fabrication of 16 Mbit DRAM and logic products. It is also perfectly adapted to the future technologies (e.g. 64 Mbits and 256 Mbits DRAM chips).

OBJECTS OF THE PRESENT INVENTION

It is therefore a primary object of the present invention to provide a method for planarizing TEOS $SiO_2$ filled shallow isolation trenches that significantly improves the main planarization step of the prior art and which in particular eliminates the need for the chem-mech polishing step.

It is still another object of the present invention to provide a method for planarizing TEOS $SiO_2$ filled shallow isolation trenches that suppresses "silicon polish" and "$Si_3N_4$ pad residuals" defects .

It is another object of the present invention to provide a method for planarizing TEOS $SiO_2$ filled shallow isolation trenches that eliminates the concerns due to the process window of the prior planarization main step.

It is still another further object of the present invention to provide a method for planarizing TEOS $SiO_2$ filled shallow isolation trenches that is reproducible and has high manufacturing yields in particular at the final test (FT).

It is still another further object of the present invention to provide a method for planarizing TEOS $SiO_2$ filled shallow isolation trenches that simpler and has higher throuputs than the prior art method for significant cost reduction.

The novel features believed to be characteristic of this invention are set forth in the appended claims. The invention itself, however, as well as other objects and advantages thereof, may be best understood by reference to the following detailed description of an illustrated preferred embodiment to be read in conjunction with the accompanying drawings.

DESCRIPTION OF THE PREFERRED EMBODIMENTS

Steps described by reference to FIGS. 1 to 7 are still valid for the new planarization process referred hereinafter to as the AT etch. They are roughly the same except that some adjustments can be made for optimization if necessary. For sake of distinction, the two AB1 and AB2 layers respectively referenced 24 and 25 in the above description will be now labelled AT1 and AT2.

Preferably, the TEOS $SiO_2$ anneal is performed after the step of TEOS $SiO_2$ filling described by reference to FIG. 5 instead of being performed after the chem-mech polishing of FIG. 13. This anneal step which still aims the densification of the TEOS $SiO_2$ material will allow a better control of final TEOS $SiO_2$ layer 22 thickness and "wrap-around" depth.

The new planarization process (AT etch) is typically achieved in three steps (for the 16 Mbits DRAM chip mentioned above).

In step 1, the structure 10 is etched using the operating conditions given hereunder. The purpose of using a $CHF_3/NF_3$ chemistry is to have an AT2 photoresist/TEOS $SiO_2$ selectivity adapted to etch the photoresist slightly faster than the TEOS $SiO_2$, but this step is not really critical.

CHF$_3$ . . . : 70 sccm
NF$_3$ . . . : 60 sccm
Pressure . . . : 24 Pa (180 mTorr)
Mag. field . . .: 0 Gauss
RF Power . . . : 560 W
Interf. endpoint: Yes
Select. AT2/TEOS: 1.5/1 (blanket)
Uniformity . . . .: <2%

Figure 17:
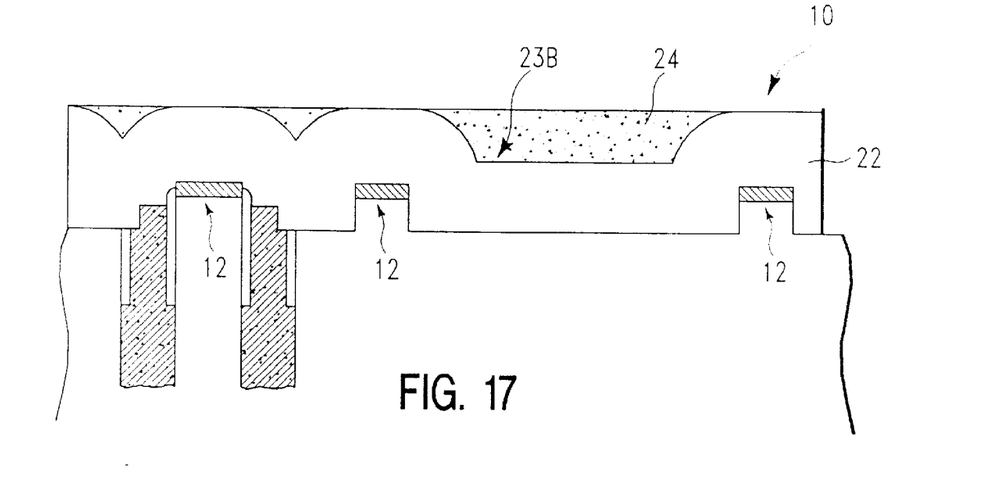
FIGS. 17 to 19 show the novel sequence of steps according to the new and improved planarization main step (AT etch) pursuant to the method of the present invention after completion of the step shown in FIG. 7.

During this step, the AT2 photoresist 25 is etched until the AT2/TEOS SiO$_2$ interface is reached. By means of an adequate algorithm, an interferometric endpoint detection is used to detect when the surface of the TEOS SiO$_2$ mounts is exposed. Above listed parameters are set for obtaining the best etch uniformity (center-to-edge), typically a value less than 2%. The resulting structure is shown in FIG. 17.

Now in step 2, the structure 10 is submitted to the same chemistry but with different parameters to produce a low AT1 photoresist/TEOS SiO$_2$ selectivity (or no selectivity at all). The operating conditions are given just below:

CHF$_3$ . . . : 95 sccm
NF$_3$ . . . : 35 sccm
Pressure . . . : 40 Pa (300 mTorr)
Mag field . . . : 8 Gauss
RF Power . . . : 700 W
Interf. endpoint: Yes
Overetch . . . : 6 s
Select. AT1/TEOS: 0.95 to 1.05/1 (blanket)
Uniformity . . . : <1%

Figure 18:
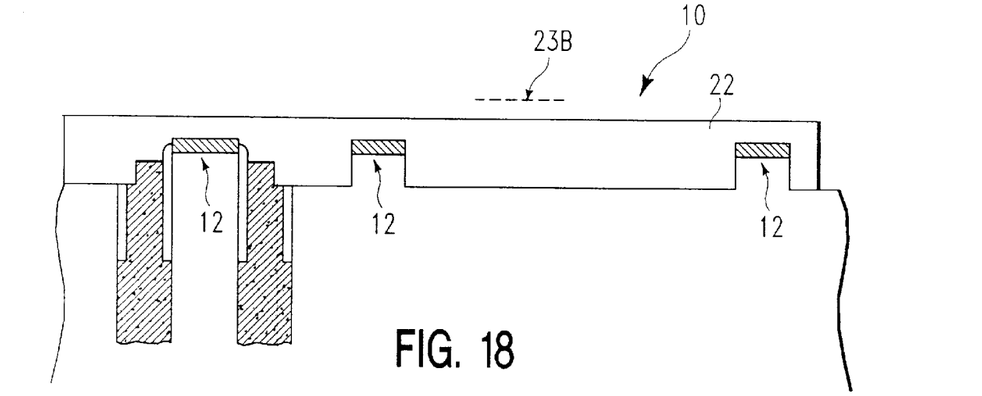

This step is more critical. In order to compensate the pattern factor effects between the "larray" and ".kerf/support/street" regions, the TEOS SiO$_2$ material and the AT1 photoresist of layer 24 are etched with approximately the same etch rate. Likewise, these parameters are set for obtaining the best possible etch uniformity (center-to-edge), e.g. less than 1%. Interferometric endpoint detection is used to detect when the TEOS SiO$_2$ at the bottom of recess 23B is reached. An overetch is performed for total removal of the AT1 photoresist material. After this step, there are no fences 22' any longer on the wafer surface as apparent from FIG. 18.

However, should some portions of the AT1 photoresist 24 remain at the structure 10 surface, they would be removed by ashing.

In step 3, a highly selective chemistry is used to remove the TEOS SiO$_2$ material of layer 22. To that end, it uses a C$_4$F$_8$/Ar chemistry whose Si$_3$N$_4$/TEOS SiO$_2$ selectivity can be set up as high as 10/1, depending on parameters setting.

Ar . . . : 150 sccm
C$_4$F$_8$ . . . : 5 sccm
Pressure . . . : 40 Pa (150 mTorr)
Mag field . . . : 5 Gauss
RF Power . . . : 800 W
Interf. endpoint: Yes
Overetch . . . : 15 s
Sel. Si$_3$N$_4$/TEOS : 9/1 (blanket)
Uniformity . . . : <4%

Figure 19:
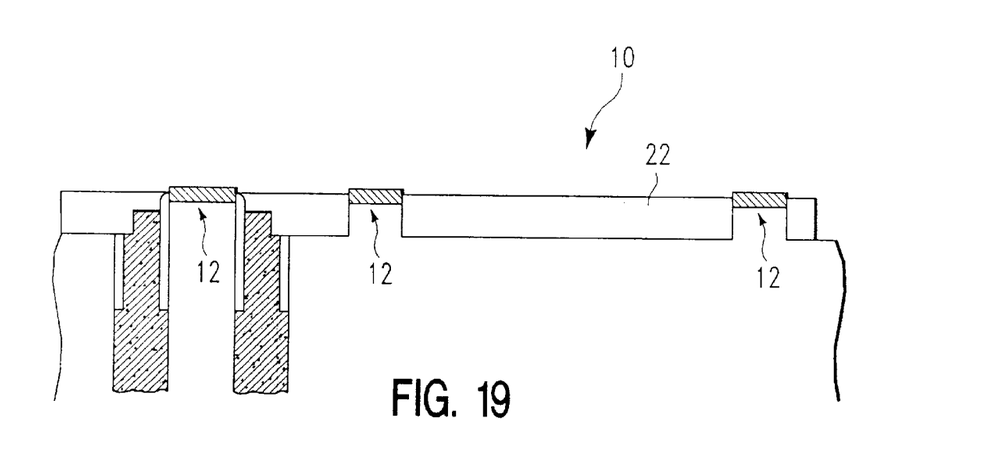

If a selectivity greater than 10/1 (e.g. 15/1) is desired, carbon oxide CO (60 sccm) should be added. The TEOS SiO$_2$ material is etched until the Si$_3$N$_4$ pad surface is attained (automatically detected by interferometry). An overetch is conducted to etch below the Si$_3$N$_4$ pad surface to produce the desired wrap-around of −60 nm. The resulting structure is shown in FIG. 19. As a result of this step, the wrap-around depth is independent from previous process drifts and this ensures an excellent reproducibility. The overetch is function of the product requirements to meet the specifications. During this overetch, should the TEOS SiO$_2$ film mentioned above remain, it would be removed, eliminating thereby the risk of "Si$_3$N$_4$ pad residuals" type of defects (which can only be observed after the Si$_3$N$_4$ pad removal step). If a given product does not require such an overetch, it is always possible to deposit the AT1 photoresist layer 24 with a different thickness.

The shallow trench formation process terminates by the step of Si$_3$N$_4$ pads removal by wet etching as described above by reference to the conventional method of the prior art.

Figure 20:
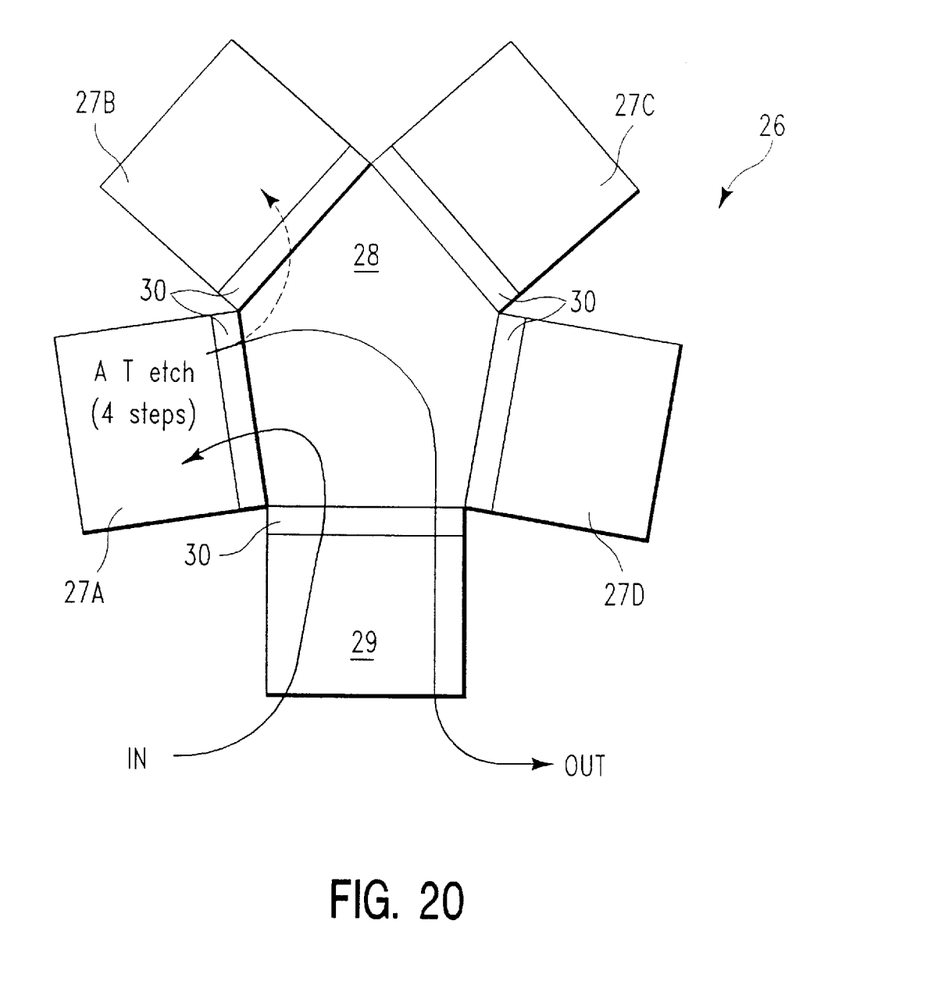
FIG. 20 shows the wafer road-map during the AT etch step wherein the wafer travels in and out only one reaction chamber of a multi-chamber plasma etcher.

FIG. 20 shows the wafer road-map during the AT etch step wherein the wafer travels in and out only one reaction chamber of the multi-chamber plasma etcher 26. Photoresist stripping in another chamber (referenced 27B) is optional as mentioned above. As apparent from FIG. 20, the measurement unit 31 (see FIG. 13) is no longer necessary.

Some process changes can be brought up to further improve the above described method of the present invention. For instance, an isotropic etch step could be performed after step 2 for complete fence elimination. Steps 1 and 2 can be merged in a single step, the chemistry of step 2 would be adequate, just the pressure would need to be reduced (e.g. 220 mT). In addition, the method of the present invention allows a better optimization of a number of parameters when compared to the conventional process described above. For instance, a thinner Si$_3$N$_4$ layer 12 e.g.: 140 nm could be used instead of 175 nm. The recess 20B depth can be reduced, e.g. 550 nm instead of 675 nm, because there is no longer any risk of etching the Si$_3$N$_4$ pads. As a result, a thinner TEOS SiO$_2$ layer 22 is now permissible: 700 nm instead of 850 nm and the TEOS SiO$_2$ overfill can be decreased from 175 nm to 50 nm (which can reveal to be useful for logic products). The AT2 photoresist layer 24 thickness can be reduced producing thereby a significant TEOS uniformity improvement across large TEOS SiO$_2$ areas. The AT1 photoresist layer thickness can also be reduced. The overetch of step 3 can be increased (e.g. 100 nm instead of 60 nm) without prejudice because the anneal of the TEOS SiO$_2$ material has been preferably done before and not after AB etch and because Si$_3$N$_4$ pads are not etched during the overetch. Thus, silicon erosion is not possible unlike with the chem-mech polishing step of the conventional method and whatever the Si$_3$N$_4$ layer 12 thickness difference between the "array" and ".kerf/support/street" regions. Finally, there is a real simplification in the design of the AT1 mask (when compared to the AB1 mask).

The new and improved planarization main step according to the method of the present invention has positive effects in terms of manufacturing yields, cost reduction, easy processing and reproducibility. Yie-lds are improved because "silicon polish" and "Si$_3$N$_4$ pad residuals" defects are eliminated, so that the process window is no longer a concern for the STI module. Cost improvement results from the processing steps reduction. The different TEOS SiO$_2$ thickness measurements (after TEOS SiO$_2$ fill, AB etch, and during chem-mech polishing) are eliminated. The AT mask is less complex than the AB mask and does not need a redesign for every new product. The long and expensive chem-mech polishing operation is no longer necessary. It is now possible to have a "full clusterized" process with no wafer handling during the whole AT etch, improving thereby defect density. Finally, a better reproducibility wafer-to-wafer can be obtained, because of improved planarization control (wafer-to-wafer, lot-to-lot). The wrap-around is now totally under control by means of interferometric endpoint detection for automatical etch stop and adjusted overetch. Wafers produced according to the teachings of the present method have a better planarity (center-to-edge, "array1"-to-".kerf/support/street" regions) and the incidence of the pattern factor effects is significantly reduced.

The improved planarization method (AT Etch) of the present invention finds extensive applications in the semiconductor industry, and in particular in the fabrication of 16 Mbit DRAM and logic products. It is perfectly adapted to the future technologies (e.g. 64 Mbits and 256 Mbits DRAM chips).

We claim:

1. An improved method for planarizing TEOS $SiO_2$ filled shallow isolation trenches formed in a semiconductor structure (10) consisting of a silicon substrate (11) coated by a patterned $Si_3N_4$ layer (12) which delineates shallow trenches (20A, 20B) formed therein with a conformal layer (22) of TEOS $SiO_2$ formed thereon filling the trenches; said method comprising the steps of:

a) forming a planarizing medium (24.25) onto the structure to produce a substantially planar surface;

b) translating said substantially planar surface into the TEOS $SiO_2$ layer by dry etching with low or no selectivity (about 1/1) but high uniformity (less than about 3%); and, c) dry etching the structure with a highly selective TEOS $SiO_2/Si_3N_4$ chemistry that etches TEOS $SiO_2$ at least eight times faster than $Si_3N_4$ and stopping etching when the top surface of said $Si_3N_4$ patterned layer is reached.

2. The method of claim 1 wherein said highly selective chemistry consists of a $C_4F_8$/Ar mixture.

3. The method of claim 2 wherein the dry etching of step c) is conducted in a reaction chamber of a plasma etcher tool with the following operating conditions:

Ar . . . : 150 sccm
    $C_4F_8$ . . . : 5 sccm
    Pressure . . . : 40 Pa (150 mTorr)
    Mag field . . . : 50 Gauss
    RF Power . . . : 800 W
    Sel.$Si_3N_4$/TEOS : 9/1 (blanket)
    Uniformity . . . : <4%.

4. The method of claim 1 wherein said highly selective chemistry consists of a $C_4F_8$/CO/Ar mixture.

5. The method of claim 4 wherein said dry etching step of step c) is conducted in a reaction chamber of a plasma etcher tool with the following operating conditions:

Ar . . . : 150 sccm
    CO . . . : 60 sccm
    $C_4F_8$ . . . : 5 sccm
    Pressure . . . : 40 Pa (150 mTorr)
    Mag field . . . : 50 Gauss
    RF Power . . . : 800 W
    Sel.$Si_3N_4$/TEOS : 15/1 (blanket)
    Uniformity . . . : <4%.

6. The method of claim 5 wherein step c) includes an overetch to produce the desired wrap-around.

7. The method of claim 1 wherein said step a) of forming a planarizing medium comprises the sub-steps of:

a1) depositing a first layer (24) of a photoresist material with a thickness slightly greater than the thickness of the TEOS $SiO_2$ layer; and, a2) depositing a second photoresist layer (25) over said first layer to produce said substantially planar surface.

8. The method of claim 7 wherein the same photoresist material is used for the first and second layers.

9. The method of claim 8 wherein said step b) of translating is performed in a single step by dry etching in a plasma etcher tool in a single chamber thereof and no chemistry change.

10. The method of claim 9 wherein said chemistry essentially consists of CHF3/NF3.

11. The method of claim 8 wherein said step b) of translating is performed in two steps (steps 1 and 2) by dry etching in a plasma etcher tool with the same chemistry but different etch parameters and in the same chamber thereof.

12. The method of claim 11 wherein said chemistry essentially consists of CHF3/NF3.

13. The method of claim 12 wherein the operating conditions for steps 1 and 2 are given below:

Step 1
    CHF3 . . . : 70 sccm
    NF3 . . . : 60 sccm
    Pressure . . . : 24 Pa (180 mTorr)
    Mag. field . . . : 0 Gauss
    RF Power . . . : 560 W
    Select. AT2/TEOS: 1.5/1 (blanket)
    Uniformity . . . : <2%
    Step 2
    CHF3 . . . : 95 sccm
    NF3 . . . : 35 sccm
    Pressure . . . : 40 Pa (300 mTorr)
    Mag field . . . : 8 Gauss
    RF Power . . . : 700 W
    $CHF_3$ . . . : 95 sccm
    $NF_3$ . . . : 35 sccm
    Pressure . . . : 40 Pa (300 mTorr)
    Mag field . . . : 8 Gauss
    RF Power . . . : 700 W
    Select. AT1/TEOS: 0.95 to 1.05/1 (blanket)
    Uniformity . . . : <1%.

14. The method of claim 8 further comprising the step of:

d) removing the remaining patterned $Si_3N_4$ layer.

15. The method of claim 8 wherein the TEOS $SiO_2$ layer is annealed prior step a).

16. The method of claim 11 wherein said patterned $Si_3N_4$ layer top surface is detected by an interferometric technique.

* * * * *